United States Patent
Okase

(10) Patent No.: US 6,322,631 B1
(45) Date of Patent: Nov. 27, 2001

(54) HEAT TREATMENT METHOD AND ITS APPARATUS

(75) Inventor: Wataru Okase, Sagamihara (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/489,607

(22) Filed: Jan. 21, 2000

Related U.S. Application Data (6262) Division of application No. 08/875,741, filed as application No. PCT/JP96/00279 on Feb. 9, 1996, now Pat. No. 6,036,482.

(30) Foreign Application Priority Data

| Feb. 10, 1995 | (JP) | 7-46342 |
| Feb. 16, 1995 | (JP) | 7-51970 |

(51) Int. Cl.[7] .............. C23C 16/52; C23C 16/00
(52) U.S. Cl. .............. 118/708; 118/712; 118/715; 118/724; 118/725; 432/241
(58) Field of Search .............. 118/715, 724, 118/725, 708, 712; 432/5, 11, 241, 153, 253

(56) References Cited

U.S. PATENT DOCUMENTS

| 4,857,689 | 8/1989 | Lee | 219/10.71 |
| 5,429,498 | 7/1995 | Okase et al. | 432/152 |
| 5,443,648 | 8/1995 | Ohkase | 118/724 |
| 5,462,397 | 10/1995 | Iwabuchi | 414/222 |
| 5,536,918 | 7/1996 | Ohkase et al. | 432/239 |
| 5,571,010 | 11/1996 | Okase | 432/239 |
| 5,575,853 | * 11/1996 | Arami et al. | 118/708 |
| 6,036,482 | * 3/2000 | Okase | 432/11 |

FOREIGN PATENT DOCUMENTS

| 62-122123 | 6/1987 | (JP) . |
| 2-82032 | 6/1990 | (JP) . |
| 4-118925 | 4/1992 | (JP) . |
| 47687/1993 | 2/1993 | (JP) . |
| 47689/1993 | 2/1993 | (JP) . |
| 5-29434 | 2/1993 | (JP) . |
| 121341/1993 | 5/1993 | (JP) . |
| 166743/1993 | 7/1993 | (JP) . |
| 6-349759 | 12/1994 | (JP) . |

* cited by examiner

Primary Examiner—Jeffrie R. Lund
(74) Attorney, Agent, or Firm—Smith, Gambrell & Russell, LLP

(57) ABSTRACT

When the processed body holding member is moved upward or downward, the pressure in the reaction pipe and the shift and mount chamber is reduced down to several to several tens Torr, to reduce wind pressure applied to the processed body and thereby to suppress pressure fluctuations in the reaction pipe. Further, when the processed body holding member is moved upward or downward, the processing gas is passed in the same direction as the movement direction of the processed body holding member at a speed higher than the movement speed of the processed body holding member, to prevent the processing gas from being opposed to the processed body, so that the resistance received by the processed body is reduced and thereby the pressure fluctuations can be suppressed in the reaction pipe.

2 Claims, 13 Drawing Sheets

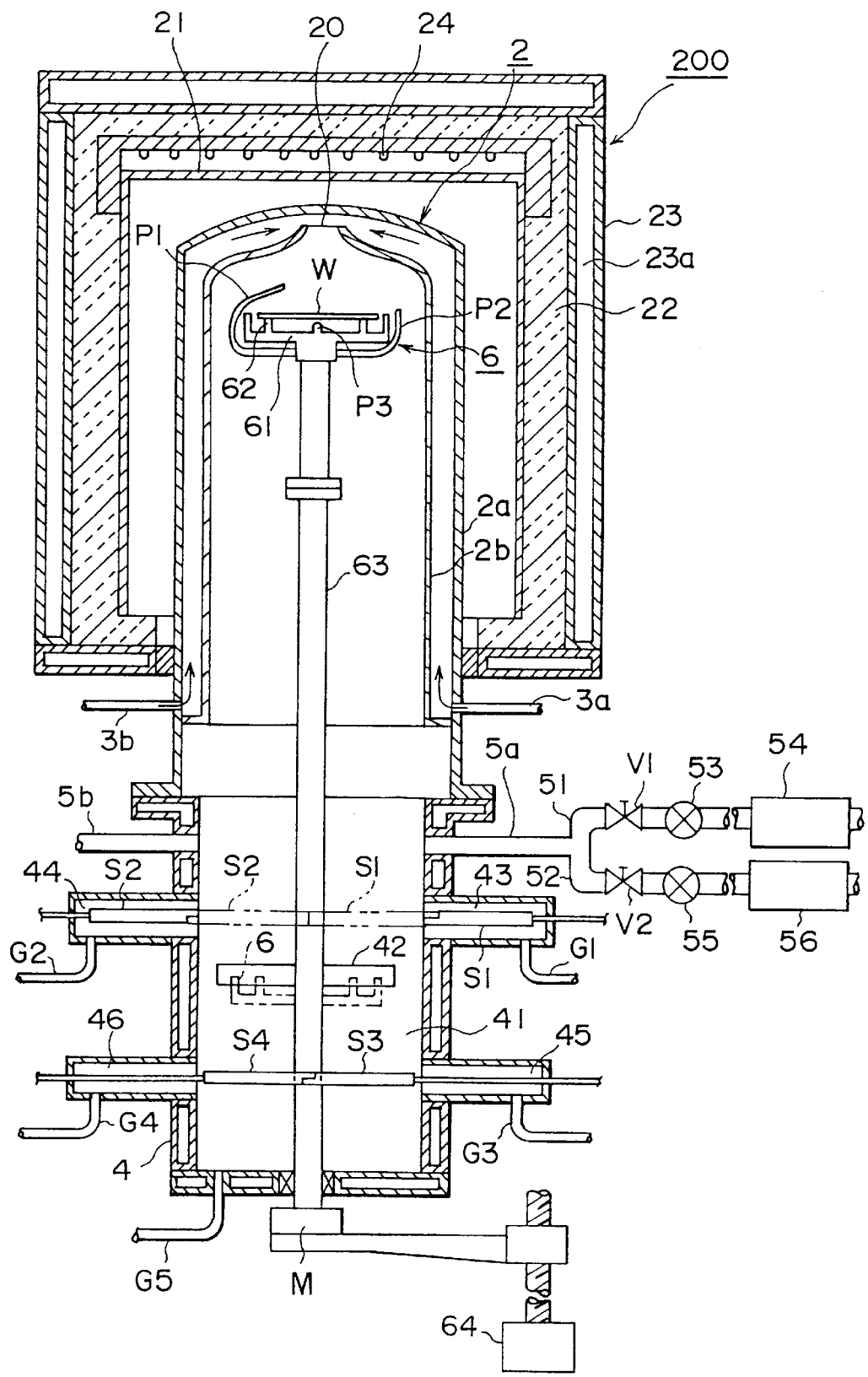
F I G. 1

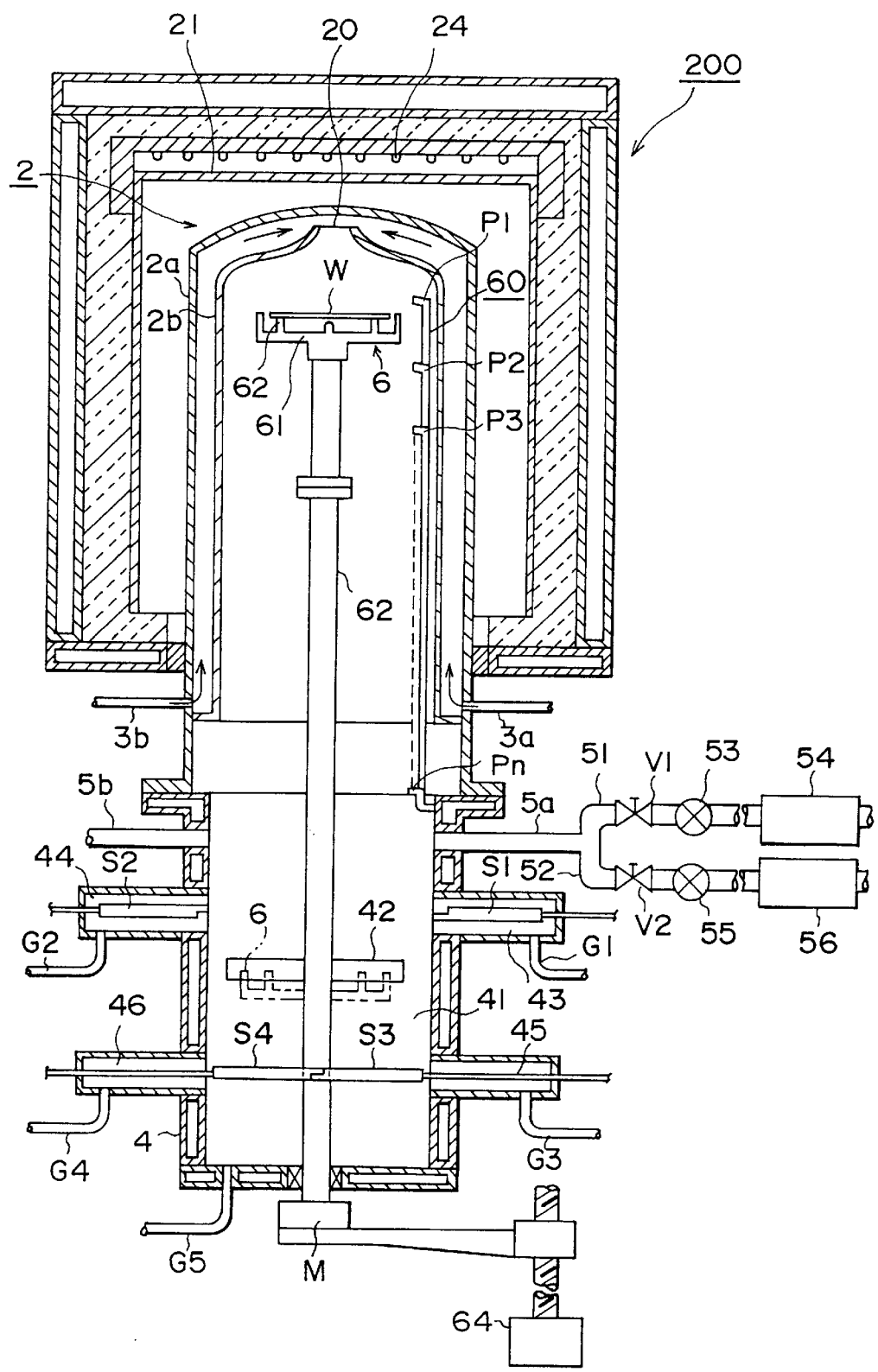
F I G. 2

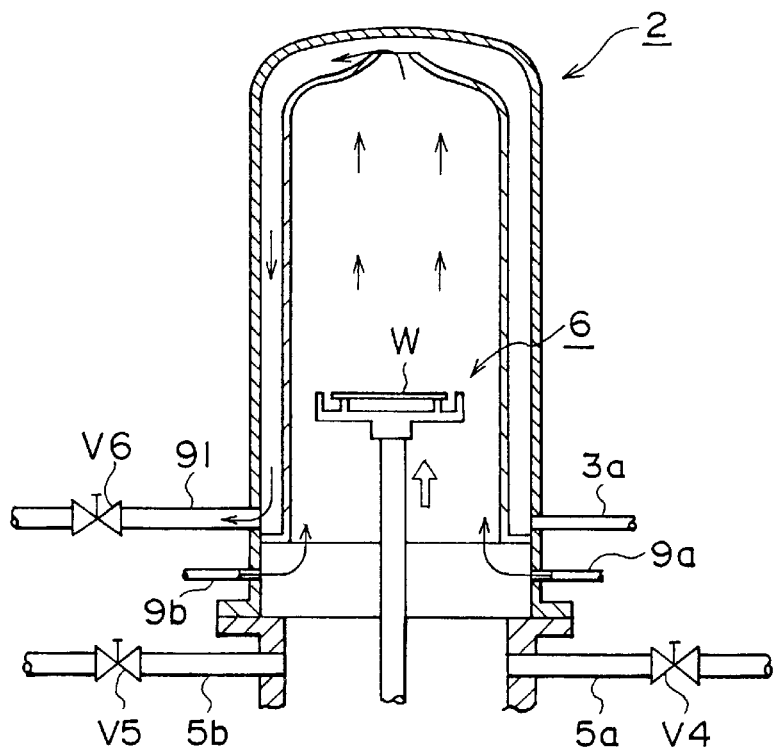
F I G. 6
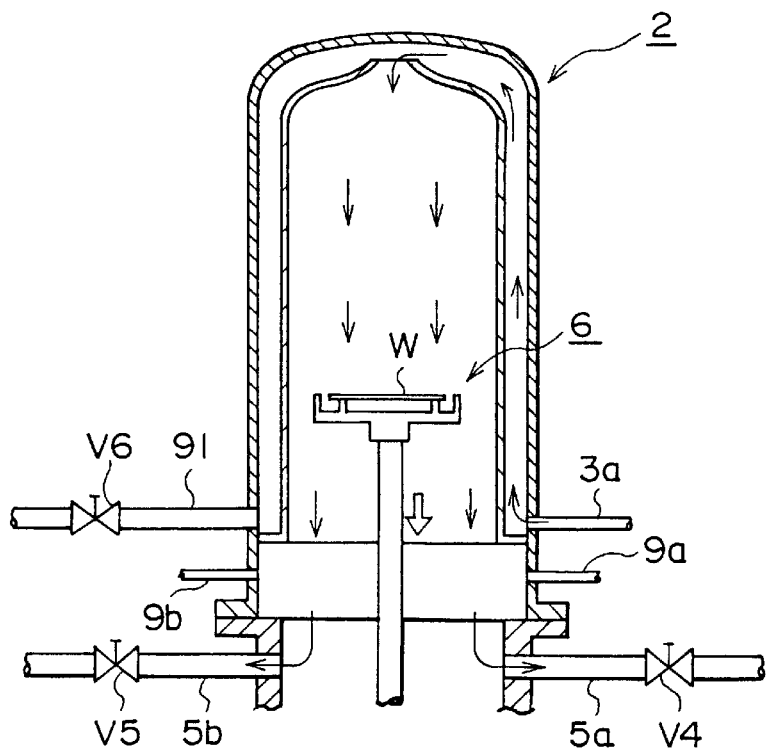
F I G. 7

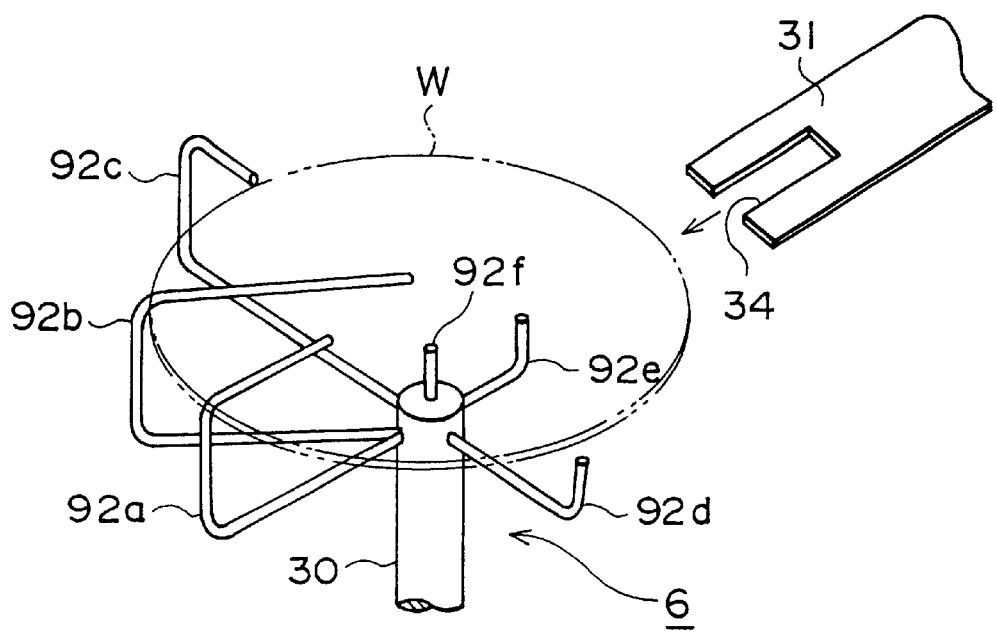
F I G. 12
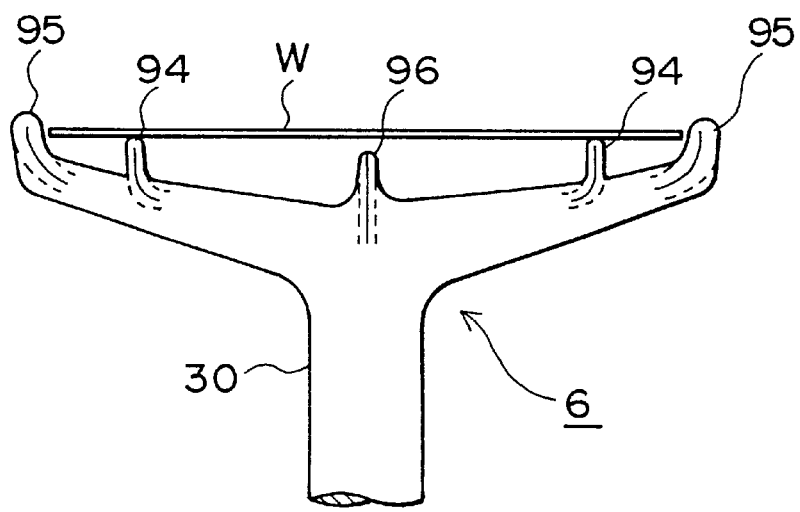
F I G. 13

HEAT TREATMENT METHOD AND ITS APPARATUS

This application is a division of application Ser. No. 08/875,741 filed Aug. 4, 1997, now U.S. Pat. No. 6,036,482, which is incorporated herein in its entirety by reference which is a 371 of PCT/JP96/000279 filed Feb. 2, 1996.

TECHNICAL FIELD

The present invention relates to a heat treatment method and an apparatus.

BACKGROUND ART

As semiconductor device manufacturing methods, there are various processing methods such as oxidizing processing for oxidizing a silicon surface at a high temperature to obtain an oxide film (an insulating film) on the silicon surface and, diffusing processing for heating a silicon layer formed with an impurity layer on the surface thereof to thermally diffuse the impurities in the silicon layer.

As the heat treatment apparatus used for oxidizing and diffusion processing, a vertical heat treatment apparatus of the batch type is well known in the art. In this heat treatment apparatus, however, in the case where an extremely thin film or a shallow position matching is required as when a capacitor insulating film or a gate oxide film is formed or when the diffusion processing is required for impurity ions, for instance, the film quality, the film thickness, and the diffusion depth are all subjected to serious influence by the thermal budget (thermal history). In the batch type heat treatment apparatus, in particular, there exists a large difference in thermal history between the wafers first carried into a reaction pipe and the wafers carried last into the reaction pipe.

To overcome this problem, a single wafer type heat treatment apparatus has been so far studied, by improving a heat treating furnace of the above-mentioned heat treatment apparatus. In this apparatus, after a wafer has been mounted on a wafer holder member one by one and then carried to a predetermined position in a reaction pipe, the carried wafer is heated quickly. This single wafer type heat treatment apparatus will be explained hereinbelow with reference to FIG. 18. In the drawing, a heat treating region of a vertical reaction pipe 1 is enclosed by a heat insulating body 10. In this reaction pipe, a supply pipe 11 and an exhaust pipe 12 are provided so that a processing gas can flow from the upper portion to the lower portion thereof.

In the reaction pipe 1, in order to secure the through-put, a wafer holder member 13 is disposed so as to be movable up and down at a speed of about 150 to 200mm/sec, for instance. On the wafer holder member 13, a single wafer W is mounted by use of a wafer carrying member (not shown) disposed in a shift and mount chamber 14 disposed under the reaction pipe 1. Therefore, after having been moved upward to a predetermined position, the wafer W is heated to a predetermined heat treatment temperature by a heating section 15 composed of a resistance heater 15a and a heat uniformalizing body 15b, and further oxidized under atmospheric pressure, for instance by supplying a processing gas into the reaction pipe 1 through the processing gas supply pipe 11.

Further, a shutter 16 which functions as a light shutting valve is movably disposed between the reaction pipe 1 and the shift and mount chamber 14 on the outer circumferential side of the shift and mount chamber 14, in order to cool the processed wafer W and to reduce the influence of the thermal history of the wafer W carried into the shift and mount chamber 14. This is because the thermal history is caused by the direct radiant heat radiated from the heating section 15. Further, the shutter 16 is formed with two semicircular cutout portions 16a and 16b at each end thereof. These cutout portions 16a and 16b are brought into tight contact with an outer circumference of a lift shaft 17 of the wafer holder member 13 when closed. Further, a purge gas supply pipe (not shown) is disposed to purge a region communicating with a lower side (lower than the exhaust pipe 12) in the reaction pipe 1 by use of a purge gas (e.g., inert gas).

In the prior art heat treatment apparatus as described above, however, when the wafer W is moved upward to a predetermined position from the shift and mount chamber 14 by use of the wafer holder member 13, the wafer W is moved upward in the reaction pipe 1 at a high speed of about 150 to 200 mm/sec against the flow of the processing gas. Therefore, when the surface area of the wafer W is large, a large resistance (wind pressure) is applied to the wafer W moving upward, so that a negative pressure is generated at the rearward (reverse surface side) region just under the wafer W. As a result, a difference in pressure is generated between the right surface side and the reverse surface side of the wafer.

Therefore, the gas stream is disturbed in the reaction pipe 1, and thereby the supply of the processing gas onto the wafer surface is not uniform. As a result, the uniformity of the intra-surface thickness of the film formed on the wafer W is degraded. For instance, when a target intra-surface uniformity of the film thickness is 50±0.5 angstrom, the difference in intra-surface thickness is as large as 50± several angstrom (e.g., 5 angstrom). Here, the above-mentioned single wafer type heat treatment apparatus has been developed in order to form an extremely thin film at a high precision so as to cope with the microminiaturization technique for the semiconductor device. Therefore, the above-mentioned problem causes a serious problem in the heat treatment apparatus from the performance standpoint.

Further, in the case where a negative pressure is generated in the region backward (the reverse side) of the wafer W as described above, when the wafer W is passed in front of the exhaust port, since the gas flows backward from the exhaust pipe 12 to the reaction pipe 1, there exists another problem in that substances adhered onto the inner wall of the exhaust pipe 12 or particles collected by a particle removing device disposed in the exhaust pipe 12 flow in the backward direction into the reaction pipe 1, with the result that the reaction pipe 1 is contaminated.

With these problems in mind, therefore, it is the object of the present invention to provide a heat treatment method and apparatus, which can suppress the pressure fluctuations in the reaction pipe, when a processed body (e.g., substrate) is moved upward or downward, in order to obtain a processed body (substrate) with a high intra-surface uniformity of film thickness.

DISCLOSURE OF THE INVENTION

The present invention is characterized in that, in a method of heat-treating a processed substrate, while supplying a processing gas, by use of the apparatus having a reaction vessel enclosed by a heating furnace; a shift and mount chamber disposed on a lower side of the reaction vessel, for shifting and mounting the processed substrate; and a processed substrate holding member movable up and down between the reaction vessel and the shift and mount chamber, for holding the processed substrate, the method comprises a step of moving the processed substrate holding member upward or downward, while reducing pressure within the reaction vessel.

In the present invention, when the processed substrate is held by the processed substrate holding member and then moved upward or downward, the pressure in the reaction vessel is reduced down to an appropriate value. By doing this, the resistance received by the processed substrate can be reduced whenever the holder member is moved upward or downward. Therefore, since a difference in pressure between the right and reverse surfaces of the processed substrate can be reduced, it is possible to suppress the pressure fluctuations in the reaction vessel. As a result, since the gas stream disturbance can be suppressed in the reaction vessel, a high intra-surface uniformity of the film thickness can be obtained on the processed substrate, and in addition the processed substrate is prevented from being contaminated by particles. In addition, in the present invention, since the shift and mount chamber and the reaction chamber are airtightly closed from each other; that is, since only the shift and mount chamber is opened to atmospheric pressure, it is possible to reduce the time required for pressure, reduction, thus increasing the throughput of the entire heat treatment apparatus.

BRIEF DESCRIPTION OF THE DRAWINGS

FIG. 1 is a longitudinal cross-sectional view showing a heat treatment apparatus used for a first embodiment of the heat treatment method according to the present invention;

FIG. 2 is a longitudinal cross-sectional view showing a heat treatment apparatus used for a second embodiment of the heat treatment method according to the present invention;

FIG. 6 is a cross-sectional view of the heat treatment apparatus shown in FIG. 5, for assistance in explaining the processing gas flow from the lower portion to the upper portion in the reaction pipe;

FIG. 7 is a cross-sectional view showing the heat treatment apparatus of FIG. 5, for assistance in explaining the processing gas flow from the upper portion to the lower portion in the reaction pipe;

FIG. 12 is a perspective view showing still another embodiment of the wafer holder means provided with thermo couples;

FIG. 13 is a side view showing still another embodiment of the wafer holder means provided with thermo couples;

BEST EMBODIMENTS FOR REALIZING THE INVENTION

First Embodiment

Figure 3:
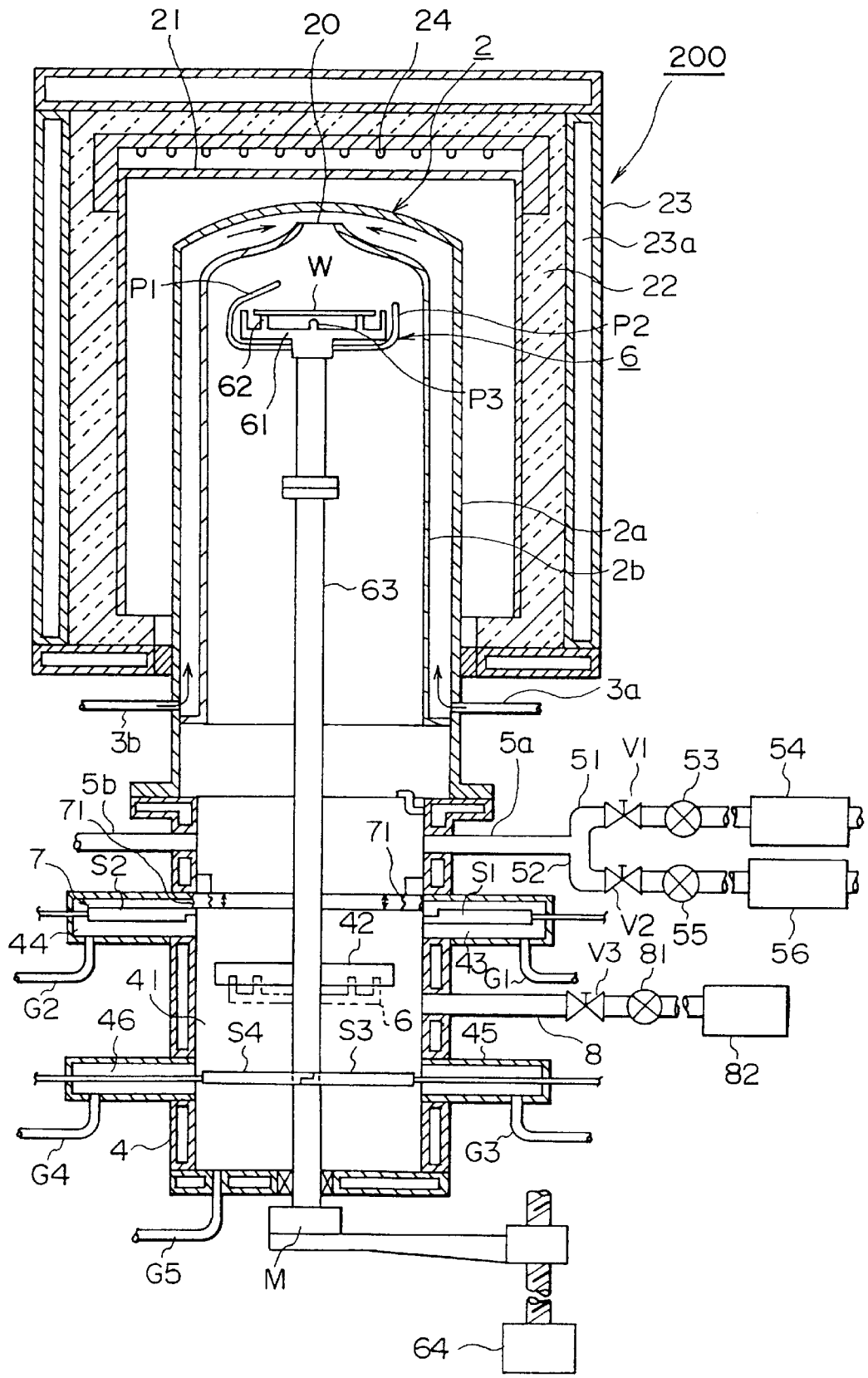
FIG. 3 is a longitudinal cross-sectional view showing a heat treatment apparatus used for a third embodiment of the heat treatment method according to the present invention.

FIG. 1 is a longitudinal cross-sectional view showing the first embodiment of the heat treatment method according to the present invention. In FIG. 1, a reference numeral 2 denotes a reaction pipe (or a reaction vessel) of a double pipe structure composed of an outer pipe 2a and an inner pipe 2b. The outer pipe 2a is formed of quartz for instance and opened at the lower end and closed at the upper end. The inner pipe 2b is also formed of quartz and disposed in the outer pipe 2a. Further, an opening portion 20 is formed at the top center of the inner pipe 2b as a processing gas supply passage or port.

The reaction pipe 2b is disposed at the center of a heating furnace 200. The heating furnace 200 is provided with a heat uniformalizing member 21 formed of silicon carbide (SiC), for instance and disposed so as to cover the upper surface and the periphery of the reaction pipe 1 with a predetermined gap relative therebetween. Further, an outer body 23 provided with a heat insulating body 22 and a water cooled jacket 23a is disposed outside the heat uniformalizing member 21. Further, a heating source 24 constructed by a resistance heating body is arranged between the upper surface of the heat uniformalizing member 21 and the heat insulating body 22.

One end of each of two processing gas supply pipes 3a and 3b is connected to the lower portion of the reaction pipe 2, and opened to a gap formed between the outer pipe 2a and the inner pipe 2b. On the other hand, the other end of each of the two processing gas supply pipes 3a and 3b is connected to a processing gas source (not shown).

On the lower side of the reaction pipe 2, a cylindrical body 4 having a water cooled jacket is disposed. The cylindrical body 4 has an upper end portion airtightly connected to the lower end portion of the reaction pipe 2 and an inner space communicating with the space formed in the reaction pipe 2.

One end of each of two exhaust pipes 5a and 5b having an inner diameter of 25 mm, for instance is connected to the upper side surface of the cylindrical body 4 in such a way as to be opposed to each other in the radial direction thereof. The exhaust pipe 5a is branched midway into two exhaust pipes 51 and 52. The other end of one exhaust pipe 51 is connected to a pressure reduction means (e.g., vacuum pump) 54 via a shut-off valve V1 and a pressure adjusting valve 53, and the other end of the other exhaust pipe 52 is connected to an exhaust pump 56 via a shut-off valve V2 and a pressure adjusting valve 55. Here, the other exhaust pipe 5b is the same in construction as that of the exhaust pipe 5a, and therefore not shown in FIG. 1.

On the lower side from the exhaust ports of the two exhaust pipes 5a and 5b disposed on the cylindrical body 4 is a shift and mount chamber 41 for shifting a wafer W from an outside of the heat treatment apparatus to wafer holder means (described later) and mounting the wafer W on the same wafer holder means. A carry port 42 for carrying a wafer W in and out therethrough is formed in the side wall portion of the shift and mount chamber 41. The carry port 42 is opened or closed by a gate valve. Further, a shutter having two shutter blades S1 and S2 (an open state is shown in FIG. 1) for shutting off radiant heat generated by the reaction pipe (or vessel) 2 is disposed around the upper portion of the shift and mount chamber 41. Further, another shutter having two shutter blades S3 and S4 for shutting off the bottom portion of the cylindrical body 4 is also disposed around the lower portion of the shift and mount chamber 41. Further, the shutter S3, S4 is formed with a semicircular cutout portion for an inner end of each of two shutter blades, so as to enclose a lift shaft 63 when closed, (the two shutter blades are closed in FIG. 1). Further, the reference numerals 43, 44, 45 and 46 are all stand-by chambers of the two shutters S1, S2 and S3, S4. Further, purge gas supply pipes G1 to G4 are connected to the bottom portions of these shutter stand-by chambers 43 to 46, respectively, and a purge gas supply pipe G5 is connected to the bottom portion of the cylindrical body 4.

The wafer holder means (or a processed substrate holding member) 6 for holding a processed substrate is disposed in the reaction pipe 2. The wafer holder means 6 is so constructed as to hold a wafer W on projecting portions 62 projecting from a mount portion 61. The wafer holder means 6 is provided with three pressure detecting portions P1 to P3. Three detection ends (top ends) of these pressure detecting portions P1 to P3 are located at a position slightly over a roughly central portion of the right surface of the wafer W, at a position slightly radially outward away from a circumferential portion of the wafer W, and at a position slightly under a roughly central portion of the reverse surface of the wafer W, respectively. These pressure detecting portions P1 to P3 are of the suction type, for instance, and a base end side of each suction pipe is connected to a detection unit (not shown) being guided through the lift shaft 63 and being taken out of the lower end of the lift shaft 63.

The wafer holder means 6 is mounted on top of the lift shaft 63. The lift shaft 63 is moved upward and downward by a lift mechanism 64 such as a ball screw disposed at the lower end portion of the cylindrical body 4. The lift shaft 63 is provided with an inner shaft driven by a motor M to rotate the wafer holder means 6.

The function of the first embodiment as described above will be described hereinbelow. First, the wafer holder means 6 is positioned in the shift and mount chamber 41 as shown by dashed lines in FIG. 1. Then, a gate valve (not shown) is opened to carry a wafer W (i.e., a processed substrate) through the carry port 42, and further mounted on the wafer holder means 6. On the other hand, here, since radiant heat is introduced from the heating source 24 into the reaction pipe 2 through the heat uniformalizing body 21, a uniform-heat region at a predetermined temperature can be formed in the reaction pipe 2. Further, two processing gases (e.g., a mixture gas of $O_2$ and HCL) are supplied from the gas supply pipes 3a and 3b into the reaction pipe 2 through the top opening portion 20 of the inner pipe 2b. The flow rates of the two processing gases flowing through the opening portion 20 of the inner pipe 2b are 6.0 liter/min in $O_2$ and 0.25 liter/min in HCL, for instance, respectively. Under these conditions, the shutter S1, S2 (shown by the dot-dot-dashed lines) and the shutter S3, S4 (shown by the solid lines) are all closed as shown in FIG. 1, so that the radiant heat from the reaction pipe 2 can be shut off by the shutter S1, S2 (shown by the dot-dot dashed lines).

Successively, after the shutter S1, S2 has been opened, the wafer holder means 6 is moved upward. At this time, the valve V1 is opened and the valve V2 is closed, so that immediately before the wafer holder means 6 is moved upward, the inner pressure of the reaction pipe 2 and the shift and mount chamber 41 is reduced down to several to several tens of Torr by the vacuum pump 54 through the exhaust pipes 51 and 5a. Here, the pressure in the reaction pipe 2 and the shift and mount chamber 41 is decided according to the processing conditions. Under certain processing conditions, when the wafer holder means 6 is being moved upward, the pressure on the reverse surface side of the wafer W and that on the right surface side of the wafer W are both detected by the pressure detecting portions P1 to P3, to obtain a pressure difference between the right and reverse surfaces of the wafer W in correspondence to the movement speed of the wafer holder means 6. In this case, for instance, the pressure is so decided that the obtained pressure difference can be reduced below a predetermined value. Here, if the pressure in the reaction pipe 2 is reduced excessively, since the time required for pressure reduction and the time required for pressure restoration to the atmospheric pressure are both lengthened, the total throughput decreases accordingly. Therefore, here, an appropriate pressure value is decided to such a value that the disturbance of the gas stream can be sufficiently prevented at a set wafer movement speed. Further, the pressure within the reaction pipe 2 can be controlled by adjusting the opening rate of the pressure adjusting valve 53, for instance.

After the wafer holder means 6 has been moved upward to a predetermined position in the reaction pipe 2, or when the wafer holder means 6 has reached a position slightly before the heat processing region, the pressure in the reaction pipe 2 is raised up to near the atmospheric pressure by adjusting the opening rate of the pressure adjusting valve 53. After that, the valve 53 is closed and the valve V2 is opened to switch the exhaust from the vacuum pump 54 to the exhaust pump 56. Therefore, the inner pressure of the reaction pipe 2 and the shift and mount chamber 41 is set to the atmospheric pressure. Further, the wafer W is heated up to 1000° C., for instance, to form an oxide film with a film thickness of 50 angstrom on the wafer W.

After that, the valve V2 is closed and the valve V1 is opened, to reduce the inner pressure of the reaction pipe 2 and the shift and mount chamber 41 to several to several tens of Torr by use of the vacuum pump 54 Under these conditions, the wafer holder means 6 is moved downward to the shift and mount chamber 41. Further, the valve Vi is closed and the valve V2 is opened to return the pressure in the reaction pipe 2 and the shift and mount chamber 41 to the atmospheric pressure. After that, the shutter S1, S2 is shut off to dismount the wafer W from the wafer holder means 6.

As described above, in the first embodiment, when the wafer holder means 6 is being moved upward, since the pressure in the reaction pipe 2 and the shift and mount chamber 41 is reduced to a predetermined pressure, it is possible to minimize the resistance (wind pressure) applied to the wafer W when the wafer W is being moved. That is, although a negative pressure can be generated on the reverse surface side of the wafer W when the wafer W is moved upward, or on the right surface side of the wafer W when the wafer W is moved downward, since the negative pressure is small, it is possible to minimize the pressure difference between the right and reverse surface sides of the wafer W. Therefore, it is possible to suppress the pressure fluctuations in the reaction pipe 2, with the result that the disturbance of the gas stream can be suppressed.

As a result, since the processing gas can flow uniformly along the surface of the wafer W, the growth of the oxide film will not be disturbed and thereby the film thickness of the oxide film can be controlled at a high precision, so that a high intra-surface uniformity of oxide film can be obtained. Further, as described above, since the negative pressure can be reduced on the right and reverse surface sides of the wafer W during the upward or downward movement of the wafer W, when the wafer W is passed through the area near the exhaust ports, backward flow does not occur at all in the exhaust pipes 5a and 5b, or else if it occurs, the backward flow is extremely small.

As a result, since substances adhered in the exhaust pipes 5a and 5b or particles in the particle removing device will not or almost do not flow backward into the reaction pipe 2, it is possible to prevent the inside of the reaction pipe 2 from being contaminated.

Further, when a wafer W is processed for oxidization under different processing conditions in accordance with the above-mentioned method, the pressure difference between the right and reverse surfaces of the wafer W according to the movement speed of the wafer holder means 6 can be detected by the pressure detecting portions. Further, on the basis of these detected values, appropriate pressure conditions can be set, and the inner pressure of the reaction pipe 2 is reduced on the basis of the pressure conditions thus determined whenever the wafer W is being moved upward or downward Second Embodiment The second embodiment of the heat treatment method according to the present invention will be described hereinbelow with reference to FIG. 2. In this second embodiment, pressure detecting means 60 composed of a plurality of pressure detecting portions P1 to Pn are arranged in a vertical direction along the inner surface of the inner pipe 2b of the reaction pipe 2, for instance. An appropriate pressure in the reaction pipe 2 and the shift and mount chamber 41 can be obtained on the basis of the detected pressure values of these pressure detecting portions P1 to Pn, when the wafer holder means 6 is moved upward and downward. In more detail, when the wafer holder means 6 is being moved upward, the pressure in the reaction pipe 2 is detected by use of the pressure detecting portions P1 to Pn, so that the pressure distribution in the reaction pipe 2 according to the upward movement of the wafer W can be obtained on the basis of the relationship between the wafer positions and the pressure detection values. When the pressure distribution can be once obtained for each condition by changing the pressure reduction conditions, an appropriate pressure value in the reaction pipe 2 can be decided in such a way that the obtained pressure distribution can be uniformalized. Further, when the wafer holder means 6 is moved downward, an appropriate pressure value in the reaction pipe 2 can be decided in the same way. Further, this second embodiment is the same in construction as the first embodiment, for the portions related to the pressure detecting means.

In the second embodiment as described above, the pressure distribution corresponding to the moving speed of the wafer holder means 6 moved upward or downward is previously examined by use of the pressure detecting portions P1 to Pn, and then an appropriate pressure value in the reaction pipe 2 is decided in such a way that the obtained pressure distribution can be uniformalized. As a result, the pressure fluctuations in the reaction pipe 2 when the wafer holder means 6 is moved upward and downward can be suppressed, with the result that it is possible to form an oxide film on the wafer W at a high precision with a high intra-surface uniformity of the film thickness and further to prevent particles from being mixed, in the same way as with the case of the first embodiment.

Third Embodiment

The third embodiment of the heat treatment method according to the present invention will be described hereinbelow with reference to FIGS. 3 and 4. In this third embodiment, opening and closing means (shutter) 7 for shutting the radiant heat generated by the heating source 24 and further for closing the space between the reaction pipe 2 and the shift and mount chamber 41 airtightly is disposed between the reaction pipe 2 and the shift and mount chamber 41. In addition, a pressure reducing exhaust pipe 8 is connected to the shift and mount chamber 41.

Figure 4:
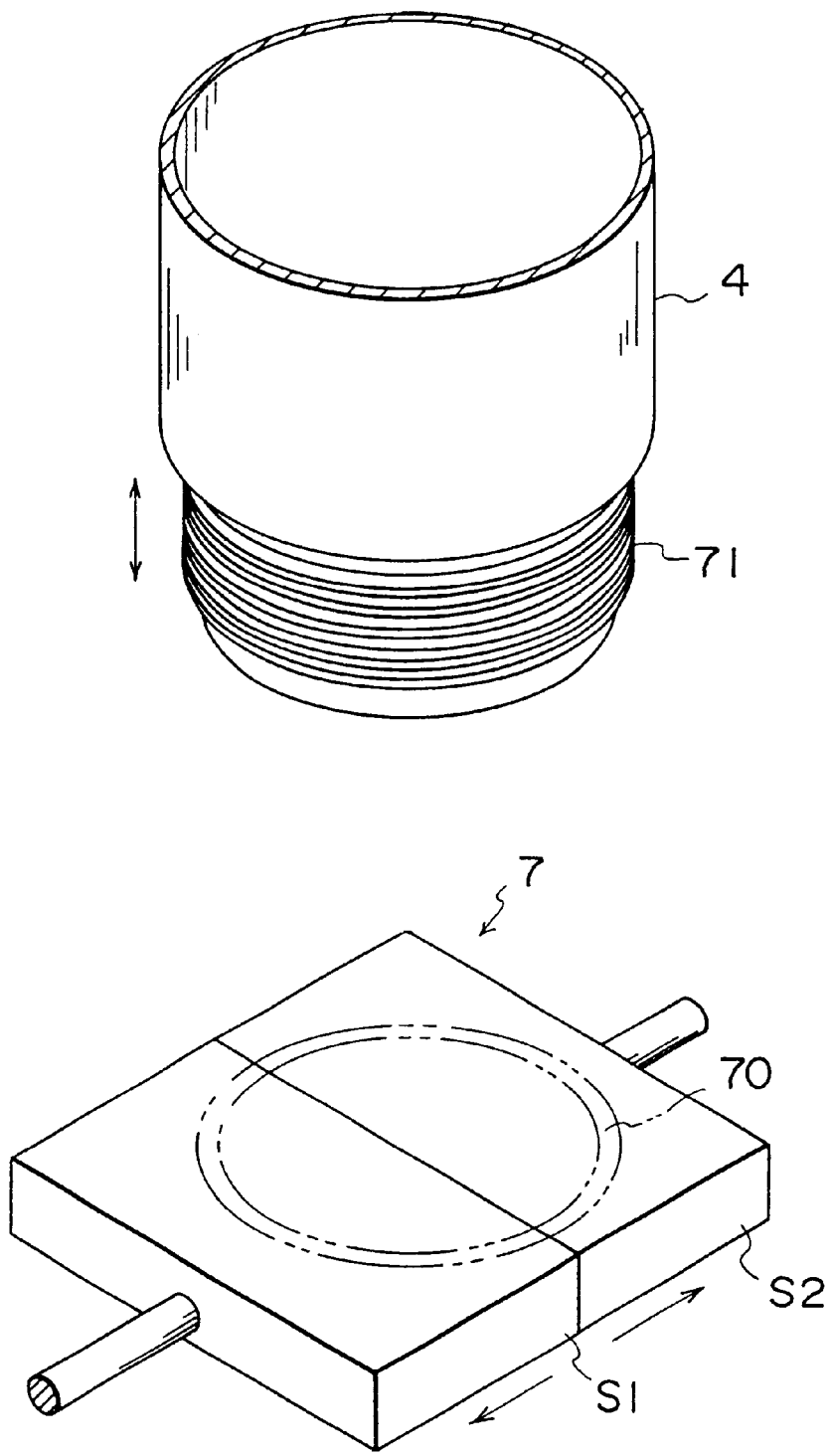
FIG. 4 is an exploded view showing the opening/closing means (bellows body and shutter) used for the third embodiment shown in FIG. 3.

Here, the opening and closing means 7 comprises a shutter S1, S2 as shown in FIGS. 2 and 3 and a ring-shaped bellows body 71 disposed on the upper inner walls of the two stand-by chambers 43 and 44 and urged to the circumferential upper surface of the two shutter blades S1 and S2. Therefore, when the shutter S1, S2 is closed, the lower surface of the urging portion of the bellows body 71 is brought into tight contact with a push region 70 (shown in FIG. 4) of the shutter blades S1 and 52, so that it is possible to partition the space airtightly between the reaction pipe 2 and the shift and mount chamber 41. The bellows body 71 is so constructed as to be extended and retracted (movable up and down) by controlling the inner pressure thereof. Further, the exhaust pipe 8 is connected to a vacuum pump 82 via a shutting valve V3 and a pressure adjusting valve 81. Further, in this third embodiment, the construction other than the above is substantially the same as with the case of the first embodiment shown in FIG. 1.

In this third embodiment, first both the shutters (S1, S2) and (S3, S4) are closed. Under these conditions, a wafer W is carried into the shift and mount chamber 41 through the carry port 42 by opening the gate valve and further mounted on the wafer holder means 6 disposed in the shift and mount chamber 41. In this case, since the bellows body 71 is urged against the upper surface of the shutter S1, S2 and further the shutter S1, S2 is closed airtightly, the reaction pipe 2 and the shift and mount chamber 41 can be partitioned airtightly. Further, the pressure of the reaction pipe 2 is reduced to a predetermined pressure reduction condition (atmosphere) via the exhaust pipe 51 in the preceding process.

After that, the pressure of the shift and mount chamber 41 is reduced down to a predetermined pressure by the vacuum pump 82 and through the exhaust pipe 8. After the valve V3 has been closed, the shutter S1, S2 is opened. Under these conditions, the wafer holder means 6 is moved upward to a predetermined position in the reaction pipe 2. When the wafer W is being moved upward, the reaction pipe 2 is pressure reduced and further exhausted by the vacuum pump 54 through the two exhaust pipes 5a and 5b down to a pressure reduction atmosphere, while supplying the processing gas and the purge gas in each predetermined flow rate, through the opening portion 20 of the reaction pipe 2 and through the purge gas supply pipes G1 to G5, respectively. Slightly before or immediately when the wafer W reaches the heat processing region, the flow rates of both the processing gas and the purge gas are increased, and further the pressure in the reaction pipe 2 is increased to near the atmospheric pressure by adjusting the opening rate of the pressure adjusting valve 53. After that, the valve V1 is closed and the valve V2 is opened, to heat-treat the surface of the wafer W or to form an oxide film on the wafer surface under the atmospheric pressure, while exhausting the reaction pipe 2 by use of the exhaust pump 56.

Successively, the valve V2 is closed and the valve V1 is opened to reduce the pressure in the reaction pipe 2 and the shift and mount chamber 41 down to a predetermined pressure by the vacuum pump 54. Under these pressure reduction conditions, the wafer holder means 6 is moved downward into the shift and mount chamber 41. Further, the shutter S1, S2 is closed and then the bellows body 7 is extended to close the space airtightly between the reaction pipe 2 and the shift and mount chamber 41. After that, the purge gas is supplied, and the pressure of the shift and mount chamber 41 is returned to the atmospheric pressure. Further, the carry port (valve gate) 42 is opened to exchange the wafer W with a new one.

In this third embodiment, the same effect as with the case of the first embodiment can be obtained. In addition, since the pressure-reducing exhaust pipe 8 is further connected to the shift and mount chamber 41 and further since the reaction pipe 2 and the shift and mount chamber 41 can be airtightly closed from each other by use of both the shutter S1, S2 and the bellows body 7, it is possible to maintain the reaction pipe 2 in a pressure reduction atmosphere, whenever the wafer W is being mounted on the wafer holder means 6 in the shift and mount chamber 41. After the wafer has been mounted on the wafer holder means 6, since only pressure of the shift and mount chamber 41 is reduced, the space whose pressure must be reduced is small, as compared with when the pressure of both the reaction pipe 2 and the shift and mount chamber 41 is both reduced, with the result that the throughput of the heat treatment apparatus can be improved as a whole.

Fourth Embodiment

Figure 5:
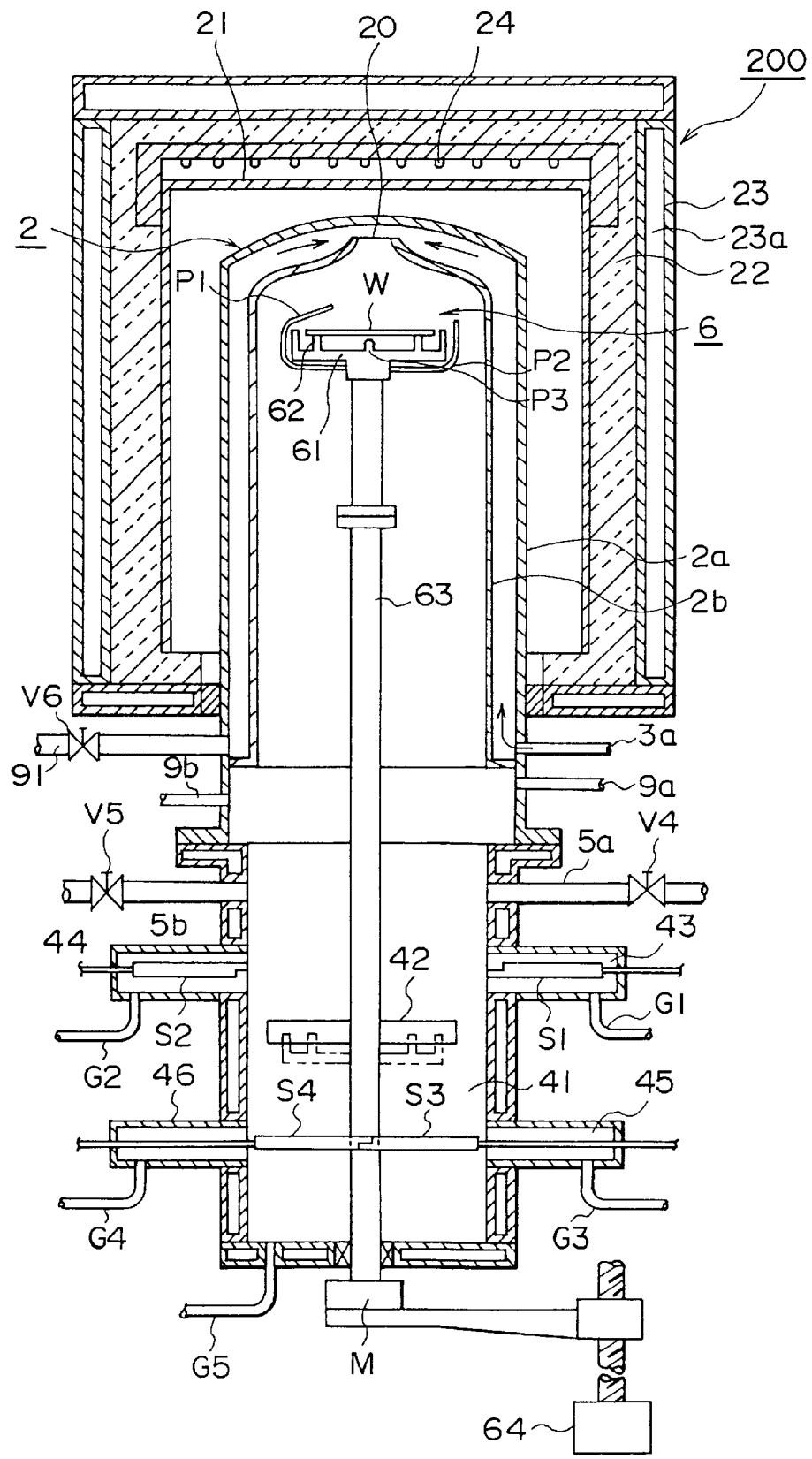
FIG. 5 is a longitudinal cross-sectional view showing a heat treatment apparatus used for a fourth embodiment of the heat treatment method according to the present invention.

The fourth embodiment of the heat treatment method according to the present invention will be described hereinbelow with reference to FIG. 5. In this fourth embodiment, one end of each of the two processing gas supply pipes 9a and 9b is connected to the lower portion of the reaction pipe 2 to supply a processing gas into the inside of the inner pipe 2b, and further one end of an exhaust pipe 91 is connected to the outer pipe 2a to exhaust the processing gas from a space between the outer pipe 2a and the inner pipe 2b of the reaction pipe 2. This exhaust pipe 91 is connected to the exhausting means (not shown) via a valve V6. The fourth embodiment is the same in construction as the first embodiment shown in FIG. 1, except the above-mentioned point and the arrangement of the pressure-reducing means. Further, as the pressure detecting means, the same means as shown in FIG. 2 can be used. Further, the construction as shown in FIG. 3 can be used as the construction other than the above-mentioned points.

In this fourth embodiment, the wafer W is mounted on the wafer holder means 6 in the shift and mount chamber 41. At the same time, the valves V4 and V5 of the exhaust pipes 5a and 5b are both closed, and the valve V6 of the exhaust pipe 91 is opened. Further, when the reaction pipe 2 is being exhausted through the exhaust pipe 91, the processing gas is supplied to the reaction pipe 2 through the processing gas supply pipes 9a and 9b, to pass the processing gas from the lower portion to the upper portion of the reaction pipe 2 at a speed higher than the upward moving speed of the wafer holder means 6, for instance as shown in FIG. 6.

After that, the shutter S1, S2 is opened to move the wafer holder means 6 upward to a predetermined position in the reaction pipe 6, for oxidization processing of the wafer W. When the wafer W is being moved upward, the purge gas is stopped from being supplied through the purge gas supply pipes G1 to G5. Upon end of this processing, the valve V6 is closed to stop the exhaust through the exhaust pipe 91 and the gas supply through the processing gas supply pipes 9a and 9b, and further the valves V4 and V5 are both opened to exhaust the reaction pipe 2 through the exhaust pipes 5a and 5b. At the same time, the processing gas is supplied through the processing gas supply pipes 3a and 3b (3b is not seen in FIGS. 6 and 7), to pass the processing gas from the upper portion to the lower portion of the reaction pipe 2 at a speed higher than the downward moving speed of the wafer holder means 6, for instance as shown in FIG. 7.

In the fourth embodiment, when the wafer holder means 6 is being moved upward or downward, since the processing gas is passed in the same direction as that of the wafer holder means 6 at a speed higher than the movement speed of the wafer holder means 6, as compared with when the wafer W is moved in a direction opposite to that of the processing gas flow, the resistance of the wafer W against the processing gas is reduced, so that the wind pressure applied to the wafer W can be extremely reduced. As a result, it is possible to suppress the pressure fluctuations in the reaction pipe 2 when the wafer holder means 6 is being moved, with the result that an oxide film can be formed on the wafer W at a high precision with a high intra-surface uniformity of the film thickness and further to prevent particles from being mixed, in the same way as with the case of the first embodiment.

Further, in this fourth embodiment, it is also preferable to reduce the pressure in the reaction pipe 2 when the wafer holder means 6 is being moved upward and downward. In this case, since the wind pressure applied to the wafer W can be further reduced, it is possible to form an oxide film on the wafer W at a high precision with a high intra-surface uniformity of the film thickness.

Further, when the wafer holder means 6 is moved upward and downward, it is also preferable to control the pressure in the reaction pipe by detecting the pressure by use of the pressure detecting portions and by controlling the opening rate of the valves on the basis of the detected pressure values by use of a control section.

Fifth Embodiment

In this fifth embodiment, the temperature of the wafer W is detected at a plurality of different points, in order to decide a speed pattern in accordance with which the speed of the wafer holder means 6 is moved to a predetermined position in the heat treatment region, a timing at which the wafer holder means 6 is moved downward from the heat treatment region, or a timing at which an oxidizing gas is switched to an inert gas or vice versa in the reaction pipe 2, for each process. For this purpose, it is possible to provide a plurality of temperature detecting devices such as thermo couples for the wafer holder means 6.

By the way, when a plurality of thermo couples are provided for the wafer holder means 6, it is necessary to consider such a construction that the wafer temperatures can be detected at a plurality of points without interference between the thermo couples and the carry arms for exchanging the wafer W with a new one. A practical wafer holder means 6 having the thermo couples of the construction as described above will be described hereinbelow.

Figure 8:
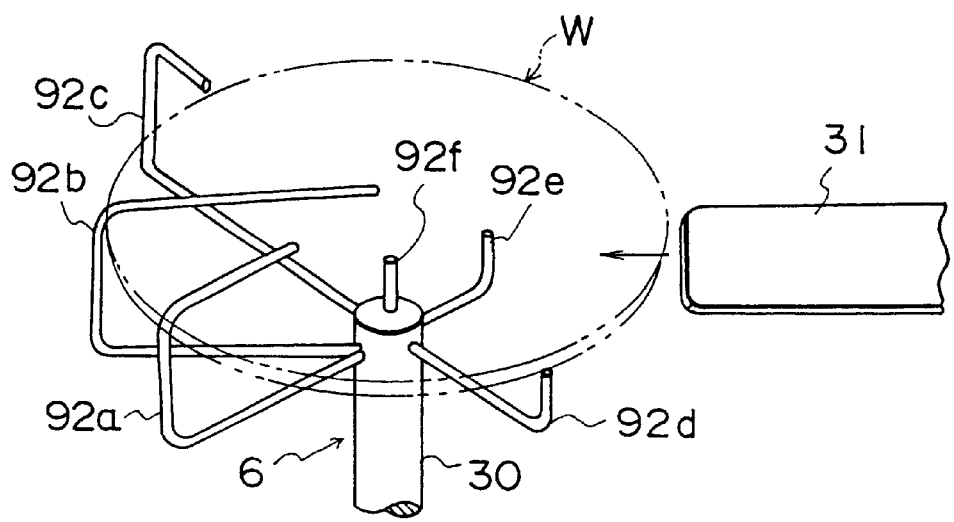
FIG. 8 is a perspective view showing an embodiment of the wafer holder means provided with some thermo couples used for the heat treatment apparatus according to the present invention.
Figure 9:
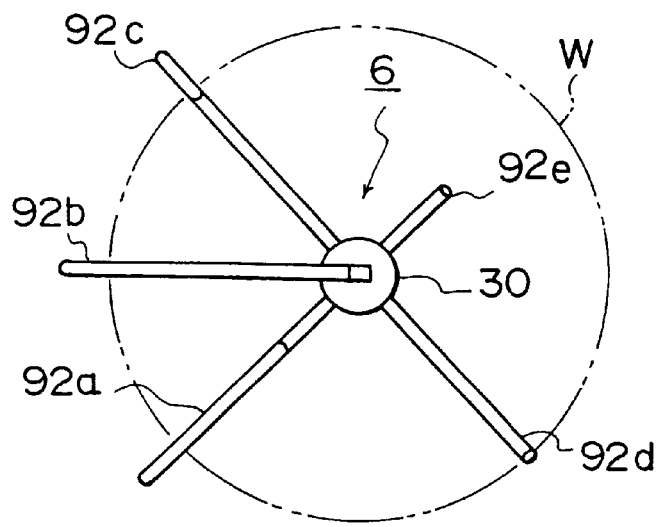
FIG. 9 is a plane view showing the wafer holder means shown in FIG. 8.
Figure 10:
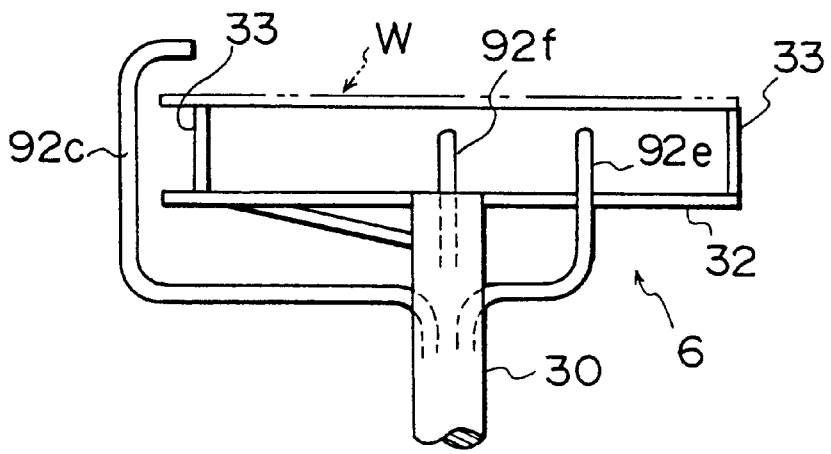
FIG. 10 is a side view showing the wafer holder means shown in FIG. 8.

In the examples as shown in FIGS. 8 to 11, a protective tube (e.g., formed of quartz) is inserted into a support shaft 30 (including the lift shaft and the rotary shaft in the afore-mentioned embodiments) of the wafer holder means 6. Further, wires of a plurality (e.g., six) thermo couples are passed through the protective tube. Further, each end of these wires of the thermo couples are taken out from the protective tube and then bent as shown in FIG. 8. In more detail, three thermo couples 92a to 92c are arranged in such a way as to extend from the reverse surface to the right surface of the wafer W and further the cross-sectional shape thereof can be seen as a horizontal U-shape when seen from the side. Further, when seen from above (in the plane position), these three thermo couples 92a to 92c are arranged extending in the wafer radial direction and being shifted 45 degrees and 45 degrees with respect to the center of the wafer W. Further, the three ends of the three thermo couples 92a to 92c are located at a position near an intermediate portion between a center and an outer edge of the wafer W, at a position near the center of the wafer W, and at a position near the outer edge of the wafer W, respectively.

Further, the three ends of the remaining three thermo couples 92d to 92f are located at a position near the outer edge of the wafer W and below a distance (through which the carry arm 31 can be inserted) downward away from the reverse surface of the wafer W, at a position near the intermediate portion between the center and the outer edge of the wafer W and below the same distance downward away from above, and a position of the center of the wafer W below the reverse surface of the wafer W. The two thermo couples 92d and 92e are located at an opposite position relative to the thermo couples 92c and 92a with respect to the center of the wafer W. These thermo couples can be formed by inserting thermo couple wires each having a wire diameter of about 0.5 mm into the quartz inner tube having an outer diameter of about 4 mm, and further by fitting a quartz outer tube closed at a top thereof and having a diameter of 5 mm to the inner tube. Further, in FIG. 10, a reference numeral 32 denotes a holder body, and 33 denotes projecting portions for supporting the wafer W. However, these portions are not shown in FIGS. 8 and 9.

In the wafer holder means 6 as shown in FIG. 8, the wafer W can be exchanged by holding the wafer W; that is, by inserting the carry arm 31 from between the two thermo couples 92d and 92e to between the end portions of the three thermo couples 92d, 92e and 92f and the reverse surface of the wafer W. Therefore, it is possible to prevent the interference between the carry arm 31 and the thermo couples 92a to 92f.

Figure 11:
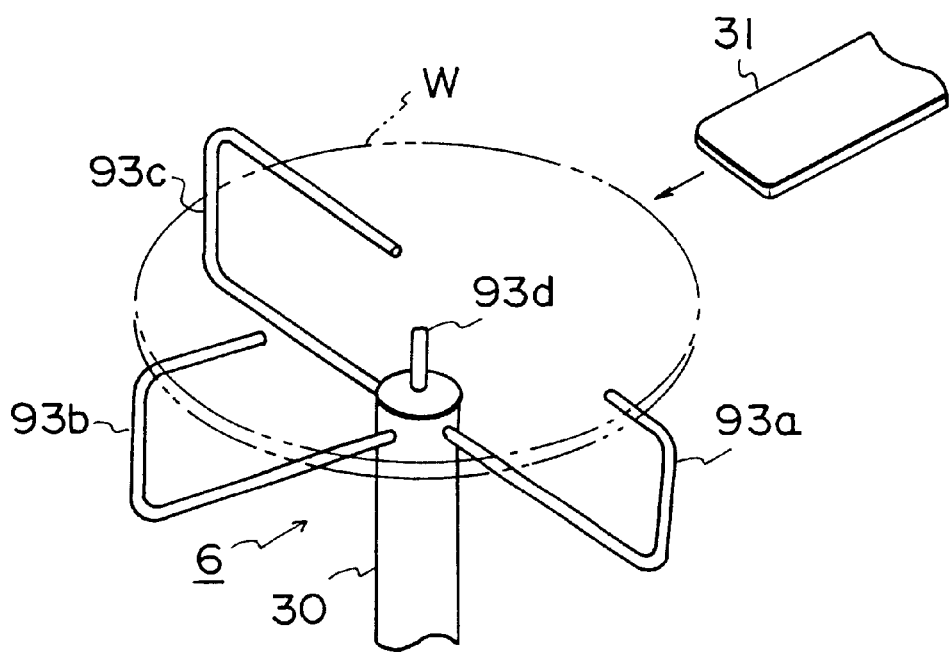
FIG. 11 is a perspective view showing another embodiment of the wafer holder means provided with thermo couples.

Further, as shown in FIG. 11, it is possible to arrange three thermo couples 93a to 93c for detecting the right surface side of the wafer W by shifting 90 degrees and 90 degrees with respect to the center of the wafer W, in such a way that the carry arm 31 can be inserted from the reverse surface side of the water W (where the thermo couples 93a to 93c are not arranged) into between the reverse surface of the wafer W and the central thermo couple 93d. Or else, as shown in FIG. 12, when the wafer holder means 6 as shown in FIG. 8 is used, a carry arm 31 formed with a cutout portion 34 at an end thereof is inserted from the side of the thermo couple 92e arranged on the reverse surface of the wafer W in such a way that the two thermo couples 92e and 92f can be inserted into the cutout portion 34 of the carry arm 31 for prevention of interference between the carry arm 31 and the thermo couples 92e and 92f.

Further, it is possible to adopt such a construction that the thermo couples themselves can hold the wafer in such a way that the thermo couples have two functions for holding the wafer W and for detecting the wafer temperature. FIG. 13 is an example of this construction, in which there are provided some thermo couples 94 for holding the reverse surface of the wafer W at the circumferential edge thereof, some thermo couples 95 for detecting the temperatures of the outer circumferential edges of the wafer W, and a thermo couple 96 for detecting the temperature at the central portion of the reverse surface of the wafer W. In this case, the carry arm is inserted into a gap between the wafer W and the thermo couple 96. Further, as the some thermo couples 94 and 95, three thermo couples 94 and 95, for instance are each arranged being shifted 120 degrees and 120 degrees in the wafer circumferential direction and with respect to the center of the wafer W.

Sixth Embodiment

Figure 14:
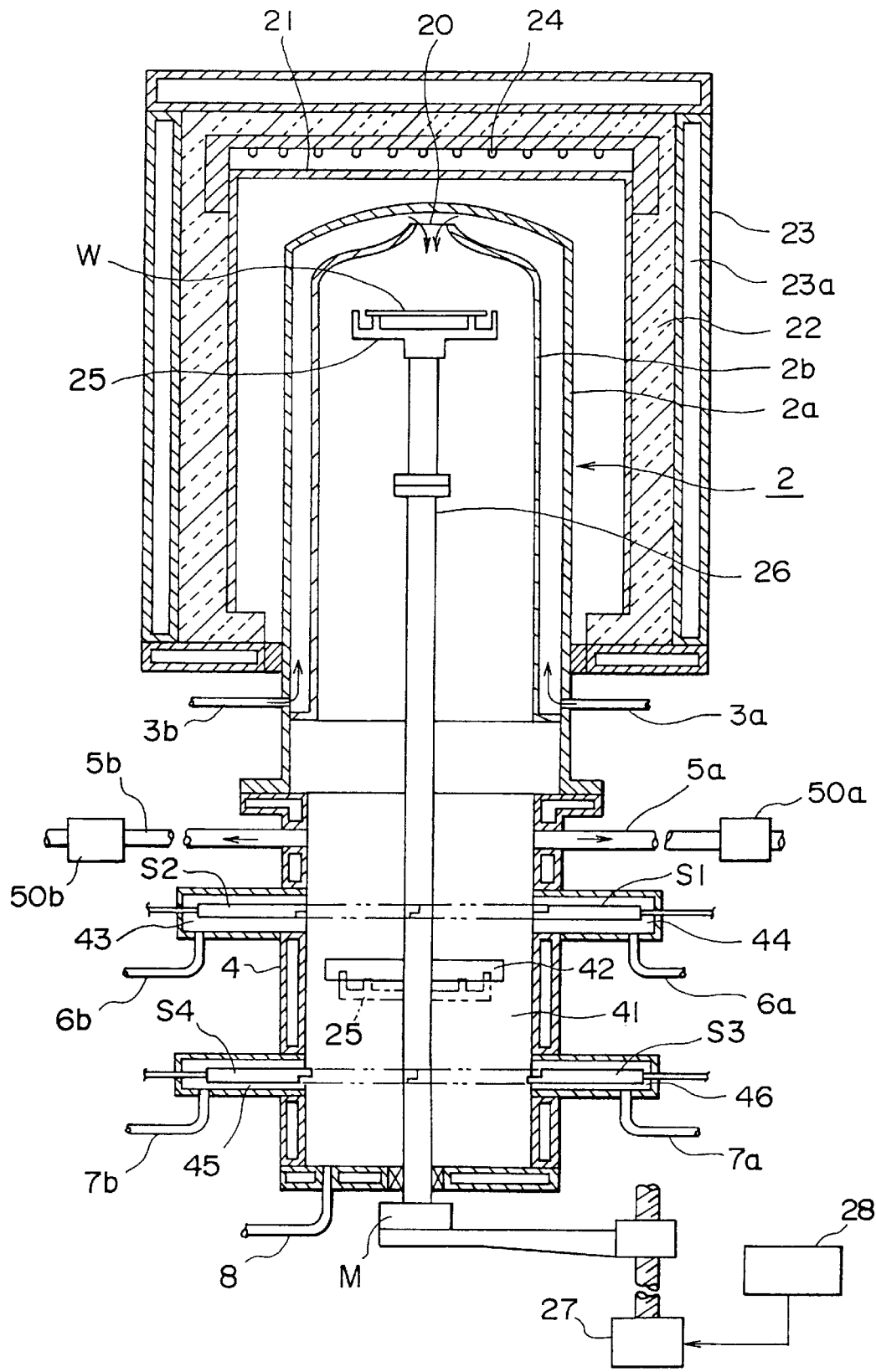
FIG. 14 is a longitudinal cross-sectional view showing a heat treatment apparatus used for a sixth embodiment of the heat treatment method according to the present invention.

FIG. 14 is a longitudinal cross-sectional view showing the sixth embodiment of the heat treatment method according to the present invention. In FIG. 14, a reference numeral 2 denotes a reaction pipe of double pipe structure composed of an outer pipe 2a and an inner pipe 2b. The outer pipe 2a is formed of quartz for instance and opened at the lower end and closed at the upper end. The inner pipe 2b is also formed of quartz and disposed within the outer pipe 2a. Further, an opening portion 20 is formed at the top center of the inner pipe 2b as a processing gas supply passage or port.

A heat uniformalizing member 21 formed of silicon carbide (SiC), for instance is disposed so as to cover the upper surface and the periphery of the reaction pipe 1 with a predetermined gap. Further, an outer body 23 provided with a heat insulating body 22 and a water cooled jacket 23a is disposed on the outside of the heat uniformalizing member 21. Further, a heating source 24 constructed by a resistance heating body is arranged between the upper surface of the heat uniformalizing member 21 and the heat insulating body 22. In this sixth embodiment, the heating furnace of the heat treatment apparatus is composed of the heat uniformalizing member 21, the heat insulating body 22, and a heating source 24. Here, however, a heat radiating lump can be used instead of the heating source.

One end of each of two processing gas supply pipes 3a and 3b is connected to the lower portion of the reaction pipe 2 in such a way as to be opened to a gap formed between the outer pipe 2a and the inner pipe 2b, and the other end of each of the two processing gas supply pipes 3a and 3b is connected to a processing gas source (not shown).

On the lower side of the reaction pipe 2, a cylindrical body 4 having a water cooled jacket is disposed. The cylindrical body 4 has an upper end portion airtightly connected to the lower end portion of the reaction pipe 2 and an inner space communicating with the space formed in the reaction pipe 2.

One end of each of two exhaust pipes 5a and 5b having an inner diameter of 25 mm, for instance is connected to the upper side surface of the cylindrical body 4 in such a way as to be opposed to each other in the radial direction thereof. The other end of each of these exhaust pipes 5a and 5b is connected to each of two exhaust pumps 50a and 50b each provided with an auto-pump controller (referred to as APC).

On the lower side from the exhaust ports of the two exhaust pipes 5a and 5b disposed on the cylindrical body 4, a shift and mount chamber 41 for shifting a wafer W from the outside of the heat treatment apparatus to the wafer holder means (described later) 25 and further mounting the shifted wafer W on the wafer holder means 25 is formed. A carry port 42 for carrying a wafer W in and out there-through is formed on the side wall portion of the shift and mount chamber 41. The carry port 42 is opened or closed by a gate valve. Further, a shutter having two blades S1 and S2 for shutting off radiant heat generated from the side of the reaction pipe 2 is disposed on the upper sides of the shift and mount chamber 41. Further, another shutter having two blades S3 and S4 for shutting off the bottom portion of the cylindrical body 4 is disposed on the lower sides of the shift and mount chamber 41. Further, each of the two shutter blades S3 and S4 is formed with a semicircular cutout portion for enclosing a lift shaft 26 airtightly at an end thereof when closed. Further, the reference numerals 43, 44, 45 and 46 are stand-by chambers of these shutters (S1, S2) and (S3, S4). Further, purge gas supply pipes 6a, 6b, 7a and 7b for purging an inert gas, for instance are connected to the bottom portions of the shutter stand-by chambers 43, 44, 45 and 46, respectively. Further, a purge gas supply pipe 8 is connected to the bottom portion of the cylindrical body 4.

The wafer holder means 25 for holding a processed substrate is disposed in the reaction pipe 2. The wafer holder means 25 is mounted on top of the lift shaft 26. The lift shaft 26 is moved upward and downward by a lift mechanism 27 such as a ball screw disposed at the lower end portion of the cylindrical body 4. The lift mechanism 27 is controlled by a speed control section 28, so that the movement speed of the wafer holder means 25 can be controlled. The lift shaft 26 is formed with an inner shaft driven by a motor M to rotate the wafer holder means 25.

The function of the sixth embodiment as described above will be described hereinbelow. First, the wafer holder means 25 is positioned on the lower side of the shift and mount chamber 41, as shown by the dot-dot-dashed lines in FIG. 14. Then, a gate valve is opened to carry a wafer W (i.e., a processed substrate) through the carry port 42, and further mounted on the wafer holder means 25.

On the other hand, here, since radiant heat is introduced from the heating source 24 into the reaction pipe 2 through the heat uniformalizing body 21, a uniform-heat region of a predetermined temperature can be formed in the reaction pipe 2. Further, two processing gases (e.g., a mixture gas of $O_2$ and HCL) are supplied from the gas supply pipes 3a and 3b into the reaction pipe 2 through the top opening portion 20 of the inner pipe 2b. The flow rates of the two processing gases flowing through the opening portion 20 are 6.0 liter/min in $O_2$ and 0.25 liter/min in HCL, for instance, respectively. Under these conditions, the two shutters S1, S2 and S3, S4 are both closed as shown in FIG. 14, so that the radiant heat from the reaction pipe 2 can be shut off by the shutter S1, S2.

Further, a purge gas (e.g., $N_2$ gas) is supplied into the cylindrical body 4 through the purge gas supply pipes 6a, 6b, 7a, 7b and 8, all connected to the cylindrical body 4, at a flow rate of 5 liter/min in total. Further, the processing gas and the purge gas are both exhausted through the exhaust pipes 5a and 5b, respectively. By doing this, the upper region above the exhaust pipes 5a and 5b becomes a processing gas atmosphere under atmospheric pressure. Further, the lower region below the exhaust pipes 5a and 5b becomes the purge gas atmosphere. Further, after the two shutters S1, S2 and S3, S4 have been opened, the wafer holder means 25 is moved upward.

Figure 15:
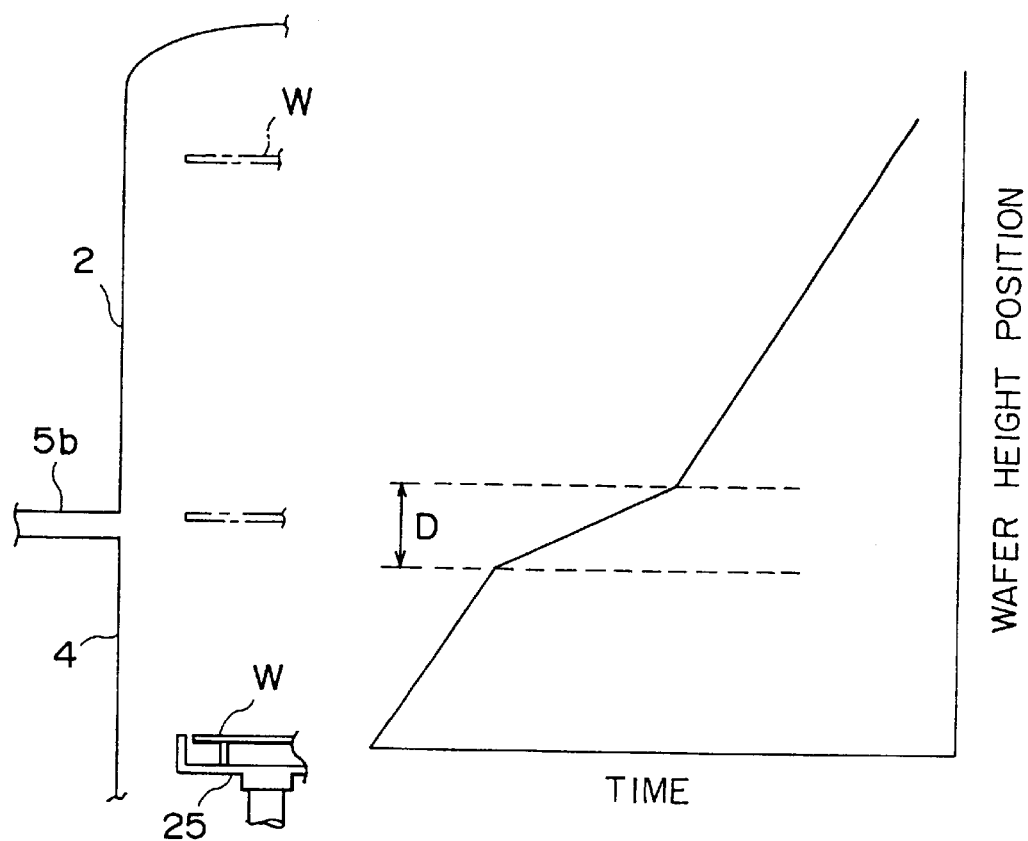
FIG. 15 is a graphical representation showing a wafer lift speed pattern according to the sixth embodiment of the heat treatment method shown in FIG. 14.

The wafer holder means 25 is moved upward under control of the control section 28 on the basis of a speed pattern as shown in FIG. 15. In more detail, first the wafer holder means 25 is moved upward from the shift and mount chamber 4 to a region D including a height the same as or roughly the same as that of the exhaust pipes 5a and 5b at a first speed (e.g., 150 to 200 mm/sec). In the region D, the movement speed of the wafer holder means 25 is decelerated to a second speed (e.g., 10 to 50 mm/sec) lower than the first speed, to such an extent that the processing gas will not flow backward by a negative pressure generated on the reverse surface side of the wafer W when the wafer W is passed. Further, after the wafer holder means 25 has passed through the height region D, the wafer holder means 25 is moved upward at a third speed higher than the second speed (e.g., the same speed as the first speed), until the wafer W reaches a predetermined position. At this position, the wafer W is heated up to 1000° C., for instance, to form an oxide film having a film thickness of 50 angstrom, for instance. After that, the wafer holder means 25 is moved downward to the shift and mount chamber 4 on the basis of the speed pattern opposite to that used when moved upward. Further, the shutters S1, S2 and S3, S4 are both closed, to exchange the wafer W with a new one through the carry outlet port 42.

Figure 16:
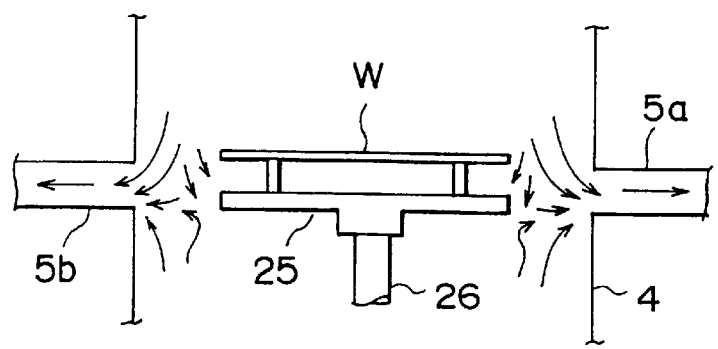
FIG. 16 is an illustration showing a gas flow near the exhaust port of the exhaust pipe in the sixth embodiment of the heat treatment method shown in FIG. 14.

As described above, in the sixth embodiment, since the wafer holder means 25 is decelerated when the wafer W is passed through the height region D the same as or roughly the same height as that of the exhaust pipes, although a negative pressure is generated on the reverse surface side of the wafer W when the wafer holder means 25 is moved upward or on the right side surface side thereof when moved downward, the generated negative pressure is sufficiently small. Therefore, as shown in FIG. 16, the stream of the processing gas and the purge gas directed toward the negative pressure region formed after the wafer W has been passed can be reduced, so that the gas near the exhaust ports flows smoothly toward the exhaust ports. Therefore, the exhaust gas will not or almost does not flow backward in the exhaust pipes 5a and 5b; in other words, even if the backward flow occurs, the degree thereof is extremely small.

As a result, substances adhered onto the exhaust pipes 5a and 5b or particles in the particle removing device will not or almost does not flow backward, so that the contamination of the reaction pipe 2 can be prevented. Further, in case the backward flow occurs in the exhaust pipes 5a and 5b, the gas flow is disturbed, so that the purge gas is mixed with the processing gas over the height region D of the exhaust pipes 5a and 5b. In this case, since the processed gas is diluted, when the wafer W enters the processing gas atmosphere, there exists a problem in that when the wafer W enters the processing gas atmosphere, the growth of the oxide film is disturbed on the surface of the wafer W. In this sixth embodiment, however, since the particles within the processing gas atmosphere are suppressed and since the disturbance of the oxide film growth can be reduced, it is possible to control the film thickness of the oxide film at a high precision, with the result that a high intra-surface uniformity of the film thickness can be obtained and thereby the yield of the products can be improved.

Here, the height region D in which the wafer W is moved at a lower speed (e.g., the second speed) is a range between a position about 10 cm upward way from the upper end of the exhaust ports and a position about 10 cm downward way from the lower end of the exhaust ports. In other words, since the wafer holder means 25 is moved at a higher speed on both upper and lower sides of this height region D and at a lower speed only within this height region D, the influence upon the throughput is not large. Further, in FIG. 15, when the wafer holder means 25 is started to move or stopped from moving, although there exist an acceleration zone and a deceleration zone strictly on both the upper and lower sides of this height region D, since the speed change can be attained momentarily, the above-mentioned acceleration and deceleration speed zones are not expressed in FIG. 15.

Seventh Embodiment

Figure 17:
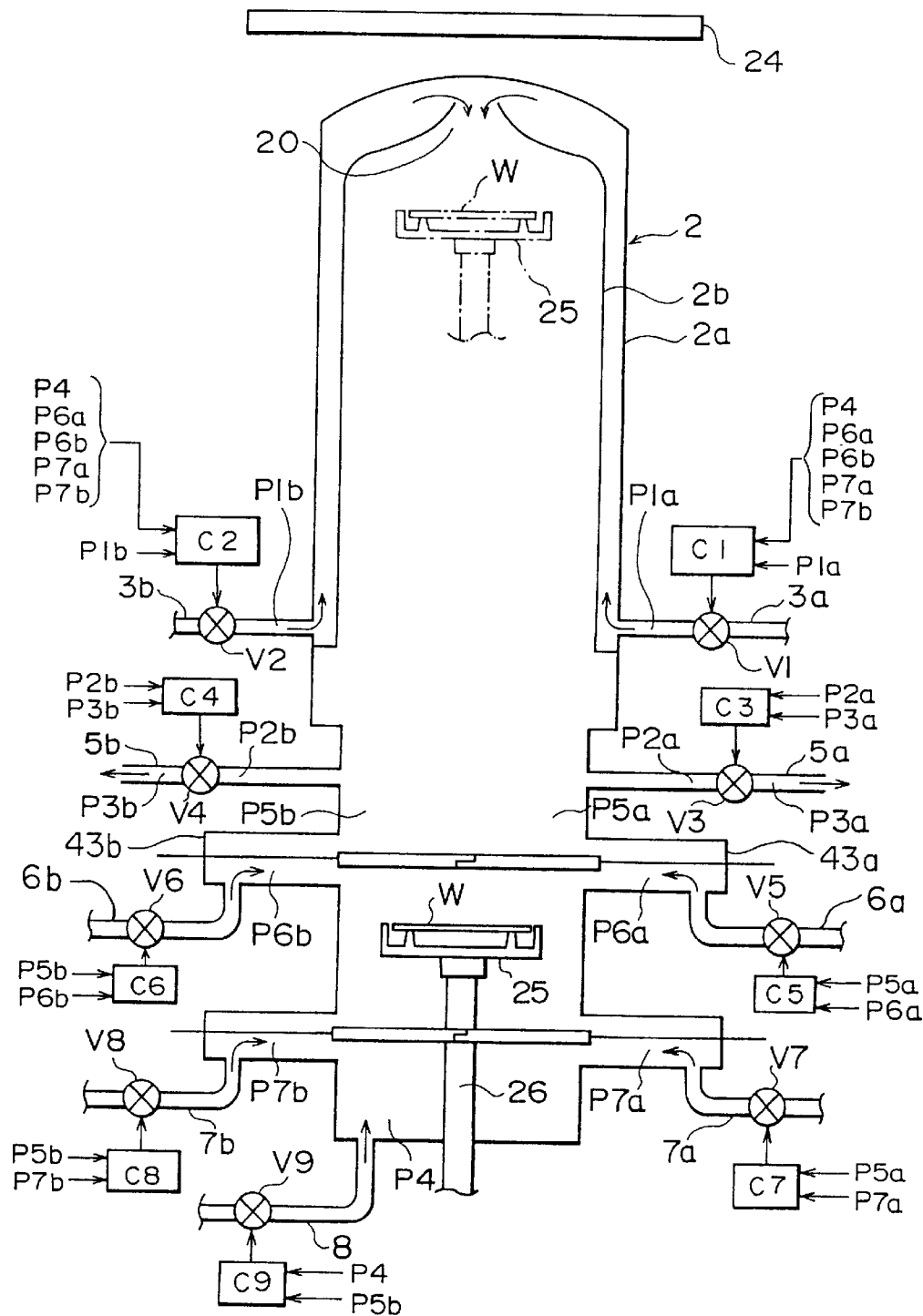
FIG. 17 is a diagrammatical construction view showing the heat treatment apparatus used for a seventh embodiment of the heat treatment method according to the present invention.
Figure 18:
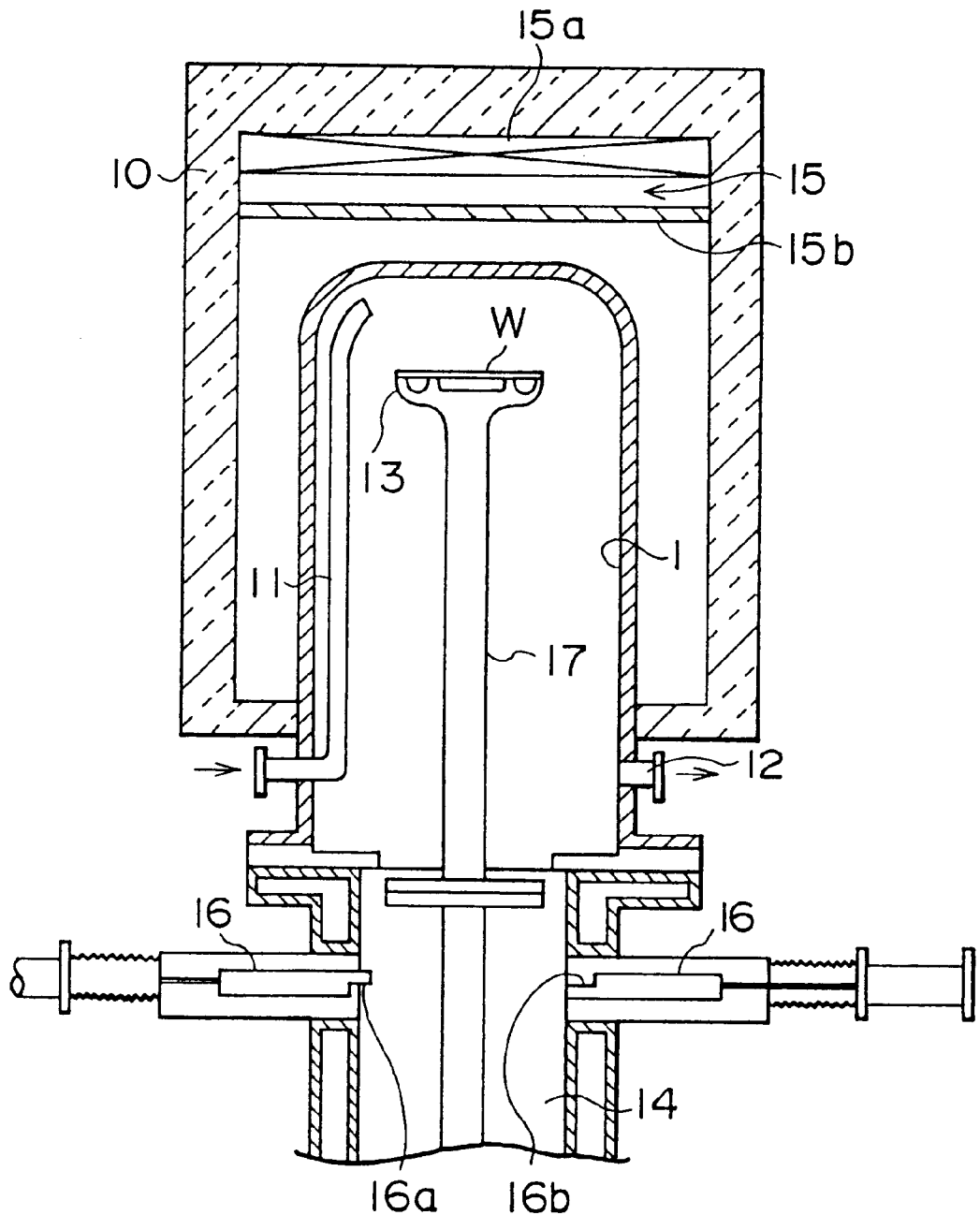
FIG. 18 is a longitudinal cross-sectional view showing a prior art heat treatment apparatus.

The seventh embodiment of the heat treatment method according to the present invention will be described hereinbelow with reference to FIG. 17. In this seventh embodiment, pressure adjusting valves V1 to V9 are provided for the processing gas supply pipes 3a and 3b, the exhaust pipes 5a and 5b, and the purge gas supply pipes 6a, 6b, 7a, 7b and 8, respectively, in such a way that a pressure difference can be provided in a predetermined region, respectively by adjusting the opening rate of each of the valves V1 to V9. However, in FIG. 17, since the construction of the apparatus shown in FIG. 17 is substantially the same as that shown in FIG. 14, except the portions related to the pressure adjustment, only the essential portions of the apparatus are shown.

In the seventh embodiment, control sections (control means) C1 to C9 are provided for controlling the valves V1 to V9, respectively. Further, pressure detecting sections P1a and P1b are provided on the downstream side (the side of the reaction pipe 2) of the valves V1 and V2 of the processing gas supply pipes 3a and 3b, respectively. Further, pressure detecting sections P2a (P2b) and P3a (P3b) are provided on the upstream side (the side of the reaction pipe 2) and the downstream side of the valves V3 and V4 of the processing gas supply pipes 5a and 5b, respectively. Further, pressure detecting sections P4 and P5a (P5b) are provided near the supply port of the purge gas supply pipe 8 in the cylindrical body 4 and a space between the exhaust pipe 5a (5b) and the shutter stand-by chamber 43a (43b), respectively. Further, pressure detecting sections P6a (P6b) and P7a (P7b) are provided near the supply ports of the purge gas supply pipes 6a (6b) and 7a (7b) in the shutter stand-by chambers 43a and 43b, respectively.

The control section C1 (C2) inputs the pressure detection value P1a (P1b) of the pressure detection section P1a (P1b) (here, the pressure detection sections and the pressure detection values are both denoted by use of the same reference numerals, respectively for convenience of explanation) and P4, P6a, P7a and P7b, and controls the opening rate of the valve V1 (V2), in such a way that P1a (P1b) becomes larger than the maximum value of P4, P6a, p6b, P7a and P7b, for instance, in such a way that a pressure difference of 1 to 25 mm can be obtained between the two, for instance. Further, the control section C3 (C4) inputs P2a (P2b) and P3a (P3b), and controls the opening rate of the valve V3 (V4) in such a way that P2a (P2b) becomes larger than P3a (P3b) by 1 to 25 mmHg, for instance.

Further, the control section C5 (C6) inputs P5a (P5b) and P6a (P6b), and controls the opening rate of the valve V5 (V6) in such a way that P6a (P6b) becomes larger than P5a (P5b) by 1 to 25 mmHg, for instance. Further, the control section C7 (C8) inputs P5a (P5b) and P7a (P7b), and controls the opening rate of the valve V7 (V8) in such a way that P7a (P7b) becomes larger than P5a (P5b) by 1 to 25 mmHg, for instance.

Further, the control section C9 inputs P4 and P5a (or P5b), and controls the opening rate of the valve V9 in such a way that P4 becomes larger than P5b by 1 to 25 mms, for instance.

The above-mentioned pressure relationship can be summarized as follows:

P1a (P1b)>P4 (e.g, when P4 is maximum)

P2a (P2b)>P3a (P3b)

P6a (P6b), P7a (P7b), P4>P5a (P5b)

In the case where the opening rates of the two valves V3 and V4 are controlled in such a way that the pressures on the upstream side of the valves V3 and V4 of the exhaust pipes 3a and 3b are higher than those on the downstream side thereof, whenever the wafer W is passed through the exhaust ports, even if gas is mixed with the surrounding gas in the negative pressure region on both the right and reverse surfaces of the wafer W, it is possible to reduce the spread of the gas flow disturbance due to the gas mixture. As a result, it is possible to reduce the influence upon the exhaust gas flow of the exhaust pipes 5a and 5b, so that the backward flow of the gas in the exhaust pipes 5a and 5b can be reduced or prevented Further, in this embodiment, the pressure is so adjusted that the pressure near the outlet port of the processing gas supply pipe 3a (3b) is slightly higher than that near the supply ports of the purge gas supply pipes 6a (6b) and 7a (7b), and further the pressure is so adjusted that the pressure at the region slightly downward side from the exhaust port is higher than that near the supply ports of the purge gas supply pipes 6a (6b) and 7a (7b) and 8. Therefore, even when the wafer W is being moved upward, it is possible to prevent the processing gas from being mixed with the purge atmosphere or the purge gas from being mixed with the processing gas atmosphere. In other words, since both the gases are sucked from each atmosphere into the exhaust pipes 5a and 5b without disturbance, it is possible to form an oxide film on the wafer W with a high intra-surface uniformity of the film thickness.

Here, in the seventh embodiment shown in FIG. 17, each pressure difference is detected between two of the sections, respectively. Therefore, the pressure of each section is detected, to calculate each pressure difference in each control section. Instead of this, however, it is also possible to use a pressure differential meter and to input the obtained pressure difference value to the control means. Further, it is also possible to combine the sixth embodiment shown in FIG. 14 with the seventh embodiment shown in FIG. 17; that is, to combine the wafer speed control with the pressure control at each section.

USABLE POSSIBILITY IN INDUSTRIAL FIELD

As described above, the heat treatment method and apparatus according to the present invention can be used suitably when an extremely thin oxide film such as a gate oxide film, a capacitor insulating film, etc. is formed on a processed body such as a semiconductor device in accordance with the oxidization process or the diffusion process of impurity ions. In addition, the present invention can be applied when the CVD processing and heating processing such as annealing processing are performed.

What is claimed is:

1. An apparatus for heat-treating a processed body, while supplying a processing gas, by use of the apparatus having a reaction vessel enclosed by a heating furnace; a shift and mount chamber disposed on a lower side of the reaction vessel, for shifting and mounting the processed body; a processed body holding member moved up and down between the reaction vessel and the shift and mount chamber, for holding the processed body; and an exhaust passage connected to the reaction vessel, which comprises:

a pressure adjusting valve disposed in the exhaust passage;

means for detecting a difference in pressure between a reaction vessel side and a downstream side of said pressure adjusting valve in the exhaust passage; and control means for controlling opening rate of said pressure adjusting valve in such a way that the pressure on the reaction vessel side is higher than that on the downstream side, on the basis of the pressure difference obtained by said detecting means.

2. An apparatus for heat-treating a processed body, while supplying a processing gas, by use of the apparatus having a reaction vessel enclosed by a heating furnace; a shift and mount chamber disposed on a lower side of the reaction vessel, for shifting and mounting the processed body; a processed body holding member moved up and down between the reaction vessel and the shift and mount chamber, for holding the processed body; a processing gas supply passage connected to the reaction vessel; an exhaust passage having an exhaust port lower than a supply port of the processing gas supply passage connected to the reaction vessel; and a purge supply passage having a supply port at a lower side region from the exhaust port communicating with the reaction vessel; which comprises:

first, second and third pressure adjusting valves disposed in the processing gas supply passage, the exhaust passage, and the purge gas passage, respectively;

means for detecting a first difference in pressure between purge gas region and a downstream side of said first pressure adjusting valve in the processing gas supply passage; a second difference in pressure between a reaction vessel side and a downstream side of said second pressure adjusting valve in the exhaust passage, and a third difference in pressure between a position near the exhaust port and a position away from the exhaust port of the purge gas region; and control means for controlling opening rate of said first pressure adjusting valve in such a way that pressure on the downstream side is higher than pressure in the purge region, opening rate of said second pressure adjusting valve in such a way that pressure on the reaction vessel side is higher than pressure on the downstream side, and opening rate of said third pressure adjusting valve in such a way that pressure at the position away from the exhaust port is higher than pressure at the position near the exhaust port, on the basis of the first, second and third pressure differences obtained by said detecting means, respectively.

* * * * *